United States Patent
Watanabe

(10) Patent No.: US 12,268,038 B2
(45) Date of Patent: Apr. 1, 2025

(54) GROUP III NITRIDE SEMICONDUCTOR LIGHT EMITTING ELEMENT AND METHOD OF MANUFACTURING THE SAME

(71) Applicant: DOWA Electronics Materials Co., Ltd., Tokyo (JP)

(72) Inventor: Yasuhiro Watanabe, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 505 days.

(21) Appl. No.: 17/312,934

(22) PCT Filed: Dec. 11, 2019

(86) PCT No.: PCT/JP2019/048537
§ 371 (c)(1),
(2) Date: Jun. 11, 2021

(87) PCT Pub. No.: WO2020/122137
PCT Pub. Date: Jun. 18, 2020

(65) Prior Publication Data
US 2022/0045239 A1     Feb. 10, 2022

(30) Foreign Application Priority Data

Dec. 14, 2018 (JP) ................................ 2018-234216
Dec. 11, 2019 (JP) ................................ 2019-223516

(51) Int. Cl.
*H10H 20/816* (2025.01)
*H10H 20/01* (2025.01)
(Continued)

(52) U.S. Cl.
CPC .... *H10H 20/8162* (2025.01); *H10H 20/0137* (2025.01); *H10H 20/812* (2025.01);
(Continued)

(58) Field of Classification Search
CPC ... H01L 33/145; H01L 33/0075; H01L 33/06; H01L 33/32; H01L 33/405;
(Continued)

(56) References Cited

U.S. PATENT DOCUMENTS

2006/0267043 A1* 11/2006 Emerson ................ H01L 33/12
257/14
2007/0034883 A1* 2/2007 Ohba ...................... H01L 33/32
257/85
(Continued)

FOREIGN PATENT DOCUMENTS

| CN | 101604716 A | 12/2009 |
|---|---|---|
| JP | 2010232364 A | 10/2010 |

(Continued)

OTHER PUBLICATIONS

Jun. 8, 2021, International Preliminary Report on Patentability issued in the International Patent Application No. PCT/JP2019/048537.

(Continued)

*Primary Examiner* — Herve-Louis Y Assouman
(74) *Attorney, Agent, or Firm* — KENJA IP LAW PC

(57) ABSTRACT

The group III nitride semiconductor light emitting element according to this disclosure has, on a substrate, an n-type semiconductor layer, a light emitting layer, a p-type AlGaN electron blocking layer, a p-type contact layer and a p-side reflection electrode, in this order, wherein, a center emission wavelength of light emitted from the light emitting layer is 250 nm or greater and 330 nm or smaller, the Al composition ratio of the p-type AlGaN electron blocking layer is 0.40 or greater and 0.80 or smaller, the film thickness of the p-type contact layer is 10 nm or greater and 50 nm or smaller, and (Continued)

the p-type contact layer has a p-type AlGaN contact layer having Al composition ratio of 0.03 or greater and 0.25 or smaller.

8 Claims, 4 Drawing Sheets

(51) Int. Cl.
    *H10H 20/812*     (2025.01)
    *H10H 20/825*     (2025.01)
    *H10H 20/832*     (2025.01)

(52) U.S. Cl.
    CPC ........ *H10H 20/825* (2025.01); *H10H 20/835* (2025.01); *H10H 20/032* (2025.01)

(58) Field of Classification Search
    CPC . H01L 2933/0016; H01L 33/40; H01L 33/04; H01L 33/007
    See application file for complete search history.

(56) References Cited

U.S. PATENT DOCUMENTS

| | | | | |
|---|---|---|---|---|
| 2014/0103289 A1* | 4/2014 | Liao | .................... | H01L 21/0259 438/46 |
| 2017/0250308 A1* | 8/2017 | Jo | .......................... | C30B 29/403 |
| 2017/0309785 A1* | 10/2017 | Watanabe | ............. | H01L 33/325 |
| 2017/0338378 A1* | 11/2017 | Fujita | ....................... | H01L 33/06 |
| 2018/0277714 A1* | 9/2018 | Furusawa | .............. | H01L 33/06 |

FOREIGN PATENT DOCUMENTS

| | | | |
|---|---|---|---|
| JP | 2016088803 | A | 5/2016 |
| JP | 2016149544 | A | 8/2016 |
| JP | 2017050439 | A | 3/2017 |
| JP | 2018049949 | A | 3/2018 |
| JP | 2018093160 | A | 6/2018 |
| TW | 201841385 | A | 11/2018 |
| WO | 2017017891 | A1 | 2/2017 |
| WO | 2018181044 | A1 | 10/2018 |

OTHER PUBLICATIONS

Aug. 27, 2020, Office Action issued by Taiwan Intellectual Property Office in the corresponding Taiwanese Patent Application No. 108145849.

Feb. 18, 2020, International Search Report issued in the International Patent Application No. PCT/JP2019/048537.

Feb. 18, 2020, Notification of Reasons for Refusal issued by the Japan Patent Office in the corresponding Japanese Patent Application No. 2019-223516.

Oct. 7, 2022, Decision on Opposition issued by the Japan Patent Office in the corresponding Japanese Patent No. 6753995.

Oct. 13, 2021, Notice of Reasons for Revocation issued by the Japan Patent Office in the corresponding Japanese Patent No. 6753995.

Nov. 29, 2024, Office Action issued by the China National Intellectual Property Administration in the corresponding Chinese Patent Application No. 201980082293.3.

\* cited by examiner

GROUP III NITRIDE SEMICONDUCTOR LIGHT EMITTING ELEMENT AND METHOD OF MANUFACTURING THE SAME

TECHNICAL FIELD

This disclosure relates to a group III nitride semiconductor light emitting element and a method of manufacturing the same, and specifically relates to a group III nitride semiconductor light emitting element having both a high light output power and an excellent reliability and a method of manufacturing the same.

BACKGROUND

Group III nitride semiconductors made of a compound of N and group III elements such as Al, Ga, and In are wide-bandgap semiconductors having direct gap band structures, and have been expected as promising materials for a wide variety of applications, including sterilization, water purification, medicine, illumination, and high-density optical recording. Of these, light emitting elements having light emitting layers made of group III nitride semiconductors can be provided for wide wavelength ranges from deep ultraviolet light to visible light, by adjusting the composition ratios of the group III elements. Therefore, their applications to a wide variety of light sources have been sought.

The luminous efficiency of a deep ultraviolet light emitting element that uses group III nitride semiconductor is extremely low in general, and it has been said that it is difficult to achieve high output. However, in order to achieve a compact and high output deep ultraviolet light emitting element, various attempts have been made to achieve high light extraction efficiency and low resistance characteristics, in addition to improve the internal quantum efficiency.

A deep ultraviolet light emitting element that emits deep ultraviolet light is generally produced as follows. That is, a buffer layer is formed on a substrate made of sapphire or single-crystalline AlN, and an n-type semiconductor layer, a light emitting layer, and a p-type semiconductor layer made of group III nitride semiconductor are formed thereon in this order. Then, an n-side electrode electrically connected to an n-type semiconductor layer and a p-side electrode electrically connected to a p-type semiconductor layer are formed, respectively. In order to establish an ohmic contact, a p-type GaN contact layer that easily increases hole concentration is typically formed on the side of the p-side electrode of the p-type semiconductor layer. However, the p-type GaN contact layer absorbs light with a wavelength of 360 nm or less, due to its band gap.

Patent Literature (PTL) 1 discloses a group III nitride semiconductor element in which a GaN layer with a film thickness of 0.01 μm or greater and 0.3 μm or smaller is provided on an AlGaInN layer having a relatively high Al composition ratio. In PTL 1, a growth mode of a GaN layer is grown as a state close to a FM (Frank-van der Merwe) mode (pseudo FM mode), and thus the surface thereof is made smooth immediately after crystal growth of the GaN layer. As a result, even if the film thickness of the GaN layer formed on the AlGaInN layer having a relatively high Al composition ratio is reduced, a smooth surface can be obtained.

CITATION LIST

Patent Literature

PTL 1: JP2010-232364(A)

SUMMARY

Technical Problem

The film thickness of the p-type GaN contact layer can be reduced due to the technique disclosed in PTL 1. Thus, light absorption by the layer can be suppressed, and the light extraction efficiency of the group III nitride semiconductor device is expected to be improved.

According to the inventor's experiments, when the film thickness of the p-type GaN contact layer is reduced to 50 nm or smaller, which is extremely thin, a group III nitride semiconductor device with a light output power higher than that of the prior art can be obtained. However, a phenomenon of a sudden degradation of light output power to nearly half the initial light output power was observed in some of thus produced samples of the group III nitride semiconductor light emitting element. As used herein, such a phenomenon of sudden deterioration of light output power will be referred to as a "sudden death." Specifically, when samples of group III nitride semiconductor light emitting element having a light emitting area of 0.057 $mm^2$ are fed with a 20 mA current to measure an initial light output power, then fed with a 100 mA for 3 seconds, and again fed with a 20 mA, samples having a decline in output to half or smaller than the initial light output power are defined as samples in which "sudden death" has occurred. Here, when plotting the light output power to the forward current with respect to the light emitting area of the group III nitride semiconductor light emitting element, the above 20 mA is a current value in the range in which the linearity is maintained, and the above 100 mA is a current value in the range in which the light emitting element generates heat and the linearity of the output is lost. In this manner, an element whose light output power suddenly deteriorates has insufficient reliability, and it is unacceptable that elements with insufficient reliability are mixed in the products, from the standpoint of product quality control.

It is therefore an object of the present disclosure to provide a group III nitride semiconductor light emitting element having both a high light output power and an excellent reliability and a method of manufacturing the same.

Solution to Problem

We diligently studied ways to address the above issues. When a p-type GaN layer is formed extremely thin such as 50 nm or smaller, reduction in large compression strain causes introduction of defects and deterioration of surface flatness. When a p-type GaN layer is grown in the FM mode, if the AlGaN layer (AlInGaN layer if it contains In), which is a layer immediately under the p-type GaN layer, has irregularities or dislocations, growth proceeds in the direction of embedding them, but it is expected that the compression strain tends to be reduced and defects tends to be introduced. Therefore, not only irregularities or dislocations in the layer immediately under the p-type GaN layer that could not be embedded, but also new dislocations may occur even if the p-type GaN layer is apparently flattened. Considering the experimental facts, the inventor thought that the light emitting elements would die suddenly when they are in the electrode forming region. Thus, we have found that, by using an AlGaN layer having an Al composition ratio x of 0.03 or greater and 0.25 or smaller as a p-type contact layer, it is possible to prevent light emitting elements from having sudden death and achieve both a high light output power and an excellent reliability, thus have completed the disclosure. Specifically, the subject matter of the present disclosure is as described below.

(1) A group III nitride semiconductor light emitting element including, on a substrate, an n-type semiconductor layer, a light emitting layer, a p-type AlGaN electron blocking layer, a p-type contact layer and a p-side reflection electrode, in this order, wherein:

a center emission wavelength of light emitted from the light emitting layer is 250 nm or greater and 330 nm or smaller;

an Al composition ratio of the p-type AlGaN electron blocking layer is 0.40 or greater and 0.80 or smaller;

a film thickness of the p-type contact layer is 10 nm or greater and 50 nm or smaller; and the p-type contact layer has a p-type AlGaN contact layer having an Al composition ratio of 0.03 or greater and 0.25 or smaller.

(2) The group III nitride semiconductor light emitting element according to (1), wherein the p-type contact layer is made only of the p-type AlGaN contact layer.

(3) The group III nitride semiconductor light emitting element according to (1), wherein the p-type contact layer has a p-type GaN contact layer between the p-type AlGaN contact layer and the p-side reflection electrode.

(4) The group III nitride semiconductor light emitting element according to any one of (1) to (3), wherein a film thickness of the p-type AlGaN contact layer is 10 nm or greater and 25 nm or smaller.

(5) A method of manufacturing a group III nitride semiconductor light emitting element, comprising:

a step of forming an n-type semiconductor layer on a substrate;

a step of forming a light emitting layer on the n-type semiconductor layer;

a step of forming a p-type AlGaN electron blocking layer on the light emitting layer;

a step of forming a p-type contact layer on the p-type AlGaN electron blocking layer; and a step of forming a p-side reflection electrode on the p-type contact layer, wherein:

a center emission wavelength from the light emitting layer is 250 nm or greater and 330 nm or smaller;

an Al composition ratio of the p-type AlGaN electron blocking layer is 0.40 or greater and 0.80 or smaller;

a film thickness of the p-type contact layer is 10 nm or greater and 50 nm or smaller; and the p-type contact layer forms a p-type AlGaN contact layer having an Al composition ratio of 0.03 or greater and 0.25 or smaller.

Advantageous Effect

According to the present disclosure, a group III nitride semiconductor light emitting element having both a high light output power and an excellent reliability and a method of manufacturing the same can be provided.

DETAILED DESCRIPTION

Figure 1:
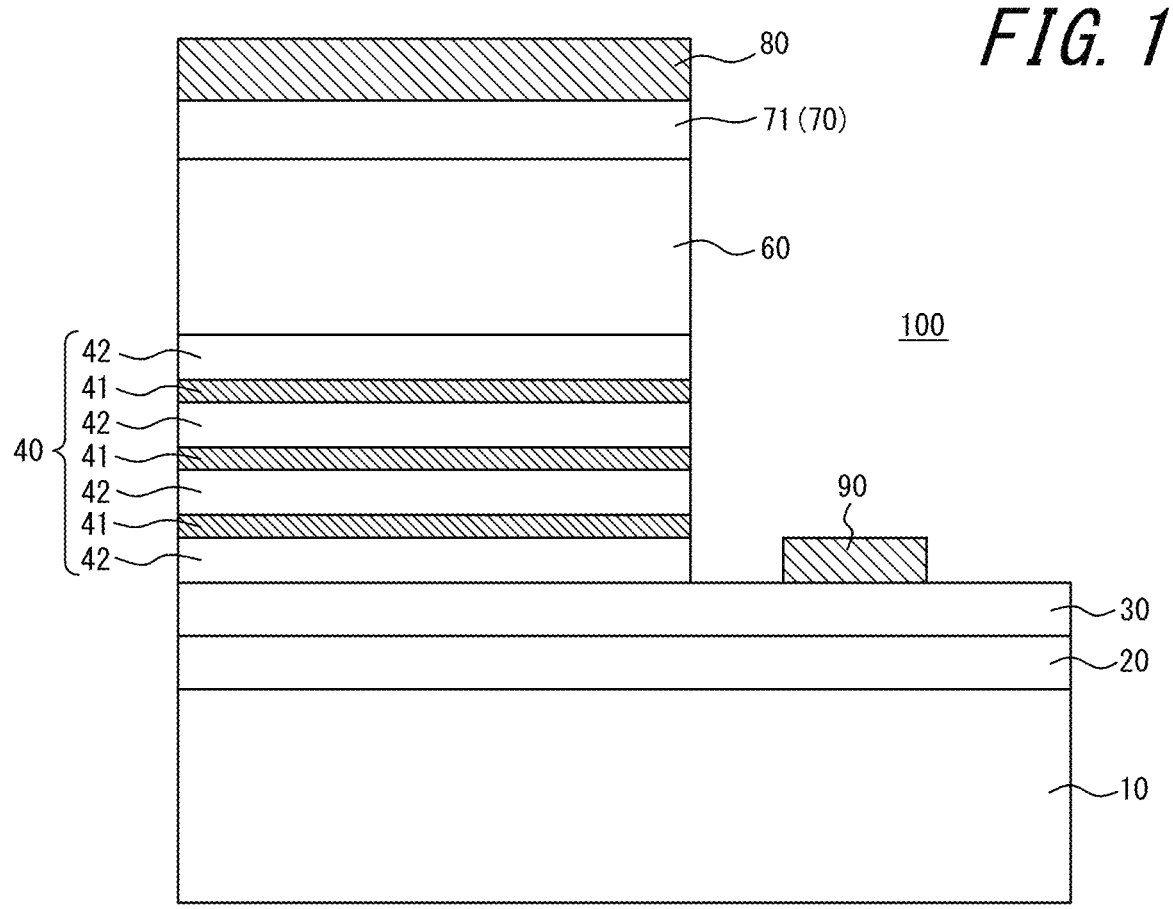
FIG. 1 is a schematic cross-sectional view illustrating an embodiment of a group III nitride semiconductor light emitting element according to this disclosure.

Prior to describing embodiments of this disclosure, the following points are described beforehand. First, the term "AlGaN" alone for which the Al composition ratio is not specified means a given compound having a composition ratio of group III elements (Al and Ga in total) with respect to N of 1:1, and any given ratio between the group III elements of Al and Ga. Further, even if no reference is made to In, which is a group III element, In may be contained at 5% or less with respect to the III elements of Al and Ga. The composition formula described including In is $Al_xIn_yGa_{1-x-y}N$, where the Al composition ratio is x and the In composition ratio is y ($0 \leq y \leq 0.05$). The term "AlN" or "GaN" alone does not mean the composition ratio contains Ga or Al, respectively. Yet, unless otherwise noted, the simple term "AlGaN" does not exclude AlN and GaN. Note that the value of the Al composition ratio can be measured, for example, by a photoluminescence measurement or an X-ray diffraction measurement.

Further, in this specification, a layer serving as an electrically p-type layer is referred to as a p-type layer, and a layer serving as an electrically n-type layer is referred to as an n-type layer. Meanwhile, a layer that is not intentionally doped with certain impurities such as Mg and Si and does not serve as an electrically p-type or n-type layer is referred to as an "i-type" or "undoped" layer. An undoped layer may contain impurities that are inevitably mixed in the production process. Specifically, when the carrier density is low (e.g., less than $4 \times 10^{16}/cm^3$), the layer is referred to as "undoped" in this specification. Further, the values of the impurity concentrations of Mg, Si, etc. are determined by SIMS analyses.

The total film thickness of the epitaxially grown layers can be measured using an interference thickness measurement system. Further, when the composition ratios of the adjacent layers are sufficiently different (e.g., the Al composition ratio differs by 0.01 or more), the film thickness of each layer can be calculated by observing the cross sections of the grown layers using a transmission electron microscope (TEM). The boundary between two adjacent layers that have the same or substantially the same Al composition ratios (e.g., the difference is less than 0.01) but have different impurity concentrations, and the film thicknesses of these layers can be determined based on TEM-EDS. The impurity concentrations of these layers can be measured by SIMS analyses. When each of layers is thin as in the case of superlattice structures, the film thickness can be measured using TEM-EDS.

Embodiments of this disclosure will now be described with reference to the drawings. In principle, like components are denoted by the same reference signs, and the description of those components will not be repeated. A substrate and layers in each diagram are exaggerated for the sake of explanation, so that the mode ratio does not conform to the actual ratio.

(Group III Nitride Semiconductor Light Emitting Element)

The group III nitride semiconductor light emitting element 100 according to an embodiment of this disclosure includes, on a substrate 10, an n-type semiconductor layer 30, a light emitting layer 40, a p-type AlGaN electron blocking layer 60, a p-type contact layer 70 and a p-side reflection electrode 80, in this order, as illustrated in FIG. 1. Then, the center emission wavelength of light emission from the light emitting layer 40 is 250 nm or greater and 330 nm or smaller, the Al composition ratio of the p-type AlGaN electron blocking layer 60 is 0.40 or greater and 0.80 or smaller, and the film thickness of the p-type contact layer 70 is 10 nm or greater and 50 nm or smaller. Further, the p-type contact layer 70 has a p-type AlGaN contact layer 71 having Al composition ratio of 0.03 or greater and 0.25 or smaller.

Note that, as illustrated in FIG. 1, preferred modes of the group III semiconductor light emitting element 100 include providing a buffer layer 20 between the substrate 10 and the n-type semiconductor layer 30, providing an exposed surface on the n-type semiconductor layer 30, and providing an n-side electrode 90 on the exposed surface. The details of each configuration will be described below.

<Substrate>

A sapphire substrate may be used as the substrate 10 of the group III nitride semiconductor light emitting element 100. An AlN template substrate may also be used as the substrate 10 in which an AlN layer is epitaxially grown on the surface of a sapphire substrate. Any sapphire substrate can be used as a sapphire substrate, and an off-angle may or may not be present. The crystal axis orientation in the grade direction when an off-angle is provided may be either the m-axis direction or the a-axis direction. For example, a main surface of the sapphire substrate can be a surface on which a C surface is graded at an off angle θ of 0.5 degrees. When an AlN template substrate is used, it is preferable that the AlN layer on the surface of the sapphire substrate has an excellent crystallinity. Further, it is also preferable that an undoped AlGaN layer is provided on the surface of the AlN template substrate. Further, an AlN single crystal substrate may be used as the substrate 10.

<n-Type Semiconductor Layer>

The n-type semiconductor layer 30 is provided on the substrate 10 via the buffer layer 20 as necessary. The n-type semiconductor layer 30 may be provided directly on the substrate 10. As the n-type semiconductor layer 30, AlGaN doped with an n-type dopant may be used. If necessary, a group III element such as In may be introduced at a composition ratio of 5% or less to obtain AlGaInN or the like. Examples of the n-type dopant include silicon (Si), germanium (Ge), tin (Sn), sulfur (S), oxygen (O), titanium (Ti), and zirconium (Zr). The dopant concentration of the n-type dopant is not limited as long as the n-type semiconductor layer 30 can serve as an n-type layer. For example, the dopant concentration can be $1.0 \times 10^{18}$ atoms/cm$^3$ to $1.0 \times 10^{20}$ atoms/cm$^3$. Further, the bandgap of the n-type semiconductor layer 30 is wider than that of the light emitting layer 40 (well layer 41 in the case of a quantum well structure), and it is preferable that the bandgap is transparent to the emitting deep ultraviolet light. Further, in addition to a single-layer structure or a multiple layer structure, the n-type semiconductor layer 30 can also include a composition-graded layer in which the composition ratio of group III elements is inclined in the crystal growth direction and a superlattice structure. The n-type semiconductor layer 30 not only forms a portion in contact with the n-side electrode 90, but also have a function of increasing crystallinity from the substrate to the light emitting layer.

<Light Emitting Layer>

The light emitting layer 40 is provided on the n-type semiconductor layer 30 and emits deep ultraviolet light having an emission center wavelength of 250 nm or greater and 330 nm or smaller. The light emitting layer 40 can be AlGaN, and the Al composition ratio thereof may be set so as to obtain a desired emission center wavelength, which can be in the range from 0.17 to 0.70.

The light emitting layer 40 may have a single layer structure having a constant Al composition ratio, or may preferably have a multiple quantum well (MQW) structure in which well layer 41 and barrier layer 42 made of AlGaN of different Al composition ratios are repeatedly formed. In any case, as necessary, a group III element such as In may be introduced at a composition ratio of 5% or less to obtain an AlGaInN material or the like, but it is more preferable to use a ternary AlGaN material using only Al and Ga as the group III element.

When the multiple quantum well structure is used, the Al composition ratio b of the barrier layers 42 may be set so as to be higher than the Al composition ratio w of the well layers 41 (that is, b>w), and the Al composition ratio b may satisfy from 0.30 to 0.95, for example, under the condition of b>w. The center emission wavelength can be roughly adjusted by the Al composition ratio w of well layers 41, and for example, if the Al composition ratio w of the well layers 41 in the light emitting layer 40 is from 0.17 to 0.68, the center wavelength of the light emitted from the light emitting layer 40 is 250 to 330 nm.

Further, the number of repetitions of well layers 41 and barrier layers 42 is not particularly limited in particular, and can be, for example, from one to ten. The layers on both ends of the light emitting layer 40 in the film thickness direction (i.e., the top and bottom layers) are preferably barrier layers. Accordingly, when the number of repetitions of the well layers 41 and the barrier layers 42 is n, those layers are referred to as "n.5 pairs of well layers and barrier layers." The film thickness of each well layer 41 may be 0.5 nm to 5 nm, and the film thickness of each barrier layer 42 may be 3 nm to 30 nm.

The conductive type of barrier layers 42 is preferably n type. This is because the electron concentration increases and it has an effect of compensating for crystal defects in well layers 41. The light emitting layer 40 can be a general multiple quantum well (MQW) structure formed by repeatedly forming barrier layers 42 and well layers 41, which are sandwiched between barrier layers 42, and if necessary, may have a structure in which the last barrier layer 42 on the p-type AlGaN electron blocking layer 60 side is removed, if necessary.

<p-Type AlGaN Electron Blocking Layer>

The p-type AlGaN electron blocking layer 60 is provided on the light emitting layer 40. The p-type AlGaN electron blocking layer 60 is a layer to block flows of electrons and inject the electrons into the light emitting layer 40 (the well layers 41 in the case when the light emitting layer 40 has an MQW structure) thereby improving the electron injection efficiency. In this disclosure, as a p-type AlGaN electron blocking layer, a p-type $Al_zGa_{1-z}N$ ($0.40 \leq z \leq 0.80$) having Al composition ratio of 0.40 or greater and 0.80 or smaller can be used. If necessary, a quaternary AlGaInN material or the like in which a group III element such as In is introduced at a composition ratio of 5% or less may be used, but it is more preferable that a ternary AlGaN material using only Al and Ga as the group III element is used. When the Al composition ratio is in this range, relatively many dislocations are formed in the p-type AlGaN electron blocking layer 60. In such a case, it is effective to use the p-type contact layer 70 according to this disclosure. Dislocations are particularly likely to be formed when the Al composition ratio is 0.60 or greater and 0.70 or smaller.

The film thickness of the p-type AlGaN electron blocking layer 60 is preferably, but not limited to, 10 nm to 80 nm, for example. The film thickness of the p-type AlGaN electron blocking layer 60 in this range ensures a high light output power. Note that the p-type AlGaN electron blocking layer 60 is preferably thicker than the barrier layer 42. Examples of p-type dopants doped in the p-type AlGaN electron blocking layer 60 include magnesium (Mg), zinc (Zn), calcium (Ca), beryllium (Be), and manganese (Mn), and typically Mg is used. The dopant concentration of the p-type AlGaN electron blocking layer 60 is not particularly limited as long as the layer can serve as p-type layer, and can be $1.0 \times 10^{18}$ atoms/cm$^3$ to $5.0 \times 10^{21}$ atoms/cm$^3$, for example.

<p-Type Contact Layer>

The p-type contact layer 70 is provided directly on the p-type AlGaN electron blocking layer 60. The p-type contact layer 70 is a layer provided to reduce contact resistance between the p-side reflection electrode 80 provided on the surface thereof and the p-type AlGaN electron blocking layer 60. In this disclosure, the film thickness of the p-type contact layer 70 is 10 nm or greater and 50 nm or smaller. Then, the p-type contact layer 70 has a p-type AlGaN layer 71 having Al composition ratio x of 0.03 or greater and 0.25 or smaller. Further, the p-type AlGaN contact layer 71 is formed directly on the p-type AlGaN electron blocking layer 60, and composition ratio x of $Al_xGa_{1-x}N$ can be $0.03 \leq x \leq 0.25$. It was confirmed by the experiment of the inventor that the p-type contact layer 70 has the p-type AlGaN layer 71 directly on the p-type AlGaN electron blocking layer 60, thus sudden death of the group III nitride semiconductor light emitting element 100 can be prevented. It is considered that this is because, when the p-type AlGaN contact layer 71 ($Al_xGa_{1-x}N$, $0.03 \leq x \leq 0.25$) is formed instead of forming a p-type GaN layer directly on the p-type AlGaN electron blocking layer 60, occurrence of dislocations formed at the initial stage of growth can be suppressed while suppressing adverse effect of deterioration of surface flatness.

It is sufficient for the p-type contact layer 70 to have the above-described p-type AlGaN contact layer 71 directly on the p-type AlGaN electron blocking layer 60 to obtain the effect of this disclosure. The p-type contact layer 70 may consist of only the p-type AlGaN contact layer 71 (see FIG. 1). Meanwhile the p-type contact layer 70 may have a p-type GaN contact layer between the p-type AlGaN contact layer 71 and the p-side reflection electrode 80 (see FIG. 2). In any case, the film thickness of the p-type AlGaN contact layer 71 can be 10 nm or greater and 50 nm or smaller, and the film thickness of the p-type contact layer 70 as a whole need only be 10 nm or greater and 50 nm or smaller as described above. Note that it is preferable that the film thickness of the p-type AlGaN contact layer 71 is 10 nm or greater and 25 nm or smaller to increase the light output power of the group III nitride semiconductor light emitting element 100 while obtaining the effect of this disclosure. Further, it is further preferable that the thickness of the p-type contact layer 70 is set to be 15 nm or greater to further ensure no sudden death.

Although not illustrated, the p-type contact layer 70 preferably has a high concentration region having a Mg concentration of $3 \times 10^{20}$ atoms/cm$^3$ or greater on the side opposite the p-type AlGaN electron blocking layer 60 (in other words, on the side in contact with the p-side reflection electrode 80), and more preferably the Mg concentration of the high concentration region is $5 \times 10^{20}$ atoms/cm$^3$ or greater. The forward voltage Vf of the group III nitride semiconductor light emitting element 100 can be reduced by increasing the hole concentration in the p-type contact layer 70. Note that the upper limit of the Mg concentration in the high concentration region in this embodiment may be, but is not limited to, $1 \times 10^{21}$ atoms/cm$^3$ considering the industrial productivity. In this case, the Mg concentration in the region on the p-type AlGaN electron blocking layer 60 side of the p-type contact layer 70 may be within typical ranges, and is typically $5 \times 10^{19}$ atoms/cm$^3$ or greater and smaller than $3 \times 10^{20}$ atoms/cm$^3$. Note that the Mg concentrations in the p-type contact layer is the average concentration of each region determined by SIMS measurements. The film thickness of the high concentration region is typically 15 nm or smaller for maintaining the crystallinity of the p-type contact layer 70.

<p-Side Electrode>

The p-side reflection electrode 80 can be provided directly on (on the uppermost surface of) the p-type contact layer 70. The p-side reflection electrode 80 is preferably made using a metal having a high reflectivity (e.g., 60% or higher) to ultraviolet light emitted from the light emitting layer 40. Examples of metals having such reflectivity include rhodium (Rh), platinum (Pt), iridium (Ir), ruthenium (Ru), molybdenum (Mo), tungsten (W), tantalum (Ta), and alloys containing at least one of these metals. These metals or alloys are preferable because they have high reflectivity to deep ultraviolet light and can provide relatively good ohmic contact between the p-type contact layer 70 and the p-side reflection electrode 80. Of these, the p-side reflection electrode 80 preferably contains rhodium (Rh) in the form of elemental metal or an alloy from the perspective of the reflectivity. Further, the film thickness, the shape, and the size of the p-side reflection electrode 80 can be suitably selected in accordance with the shape and the size of the group III nitride semiconductor light emitting element 100. The film thickness of the p-side reflection electrode 80 may be 30 nm to 45 nm, for example.

The above-described group III nitride semiconductor light emitting element 100 according to this embodiment can have both a high light output power and an excellent reliability.

While specific modes applicable to this embodiment will be described below, this embodiment is not limited to the following modes.

<Buffer Layer>

As illustrated in FIG. 1, a buffer layer 20 for reducing lattice mismatch is preferably provided between the substrate 10 and the n-type semiconductor layer 30. An undoped group III nitride semiconductor layer can be used as a buffer layer 20, and an undoped MN can be used, for example. The buffer layer 20 may have a superlattice structure. A buffer layer selected from one or more of an AlGaN layer, a composition gradient layer and a superlattice layer may be further provided between the buffer layer 20 and the n-type semiconductor layer 30.

<n-Side Electrode>

The n-side electrode 90 that may be provided on an exposed surface of the n-type semiconductor layer 30 can be formed, for example, as a metal composite film having a Ti-containing film and an Al-containing film formed on the Ti-containing film. The thickness, the shape, and the size thereof may be suitably selected according to the shape and the size of the light emitting element. The n-side electrode 90 may not be necessarily formed on the exposed surface of the n-type semiconductor layer 30 as illustrated in FIG. 1, and the n-side electrode 90 may only need to be electrically connected to the n-type semiconductor layer.

<p-Type Guide Layer>

Although not illustrated in FIG. 1, a p-type guide layer made of AlGaN or AlN having a higher Al composition ratio than that of the p-type AlGaN electron blocking layer 60 may be provided between the light emitting layer 40 and the p-type AlGaN electron blocking layer 60. Such a guide layer can promote injection of holes into the light emitting layer 40.

<n-Type Guide Layer>

Further, although not illustrated in FIG. 1, an n-type guide layer may be provided between the light emitting layer 40 and the n-type semiconductor layer 30. It is preferable that AlGaN is used for the n-type guide layer, and the Al composition ratio thereof is equal to or greater than the Al composition ratio of the n-type semiconductor layer 30 and equal to or smaller than the Al composition ratio b of the barrier layer 42. Its film thickness can be 3 nm to 30 nm. Further, it is preferable that an n-type dopant (impurity) is doped to the n-type guide layer, as with the n-type semiconductor layer 30, and its amount of dopant is lower than that of the n-type layer.

The group III nitride semiconductor light emitting element 100 according to this embodiment reflects deep ultraviolet light by forming the p-side reflection electrode 80 with a reflection electrode material, and as a result the substrate side or the substrate horizontal direction can be a main light extraction direction. Further, the group III nitride semiconductor light emitting element 100 can be a so-called flip-chip type.

(A Method of Manufacturing a Group III Nitride Semiconductor Light Emitting Element)

Next, an embodiment of a method of manufacturing the aforementioned group III nitride semiconductor light emitting element 100 will be described with reference to FIG. 3. An embodiment of the method of manufacturing the group III nitride semiconductor light emitting element 100 according to this disclosure includes: a step of forming the n-type semiconductor layer 30 on the substrate 10 (see step A); a step of forming the light emitting layer 40 on the n-type semiconductor layer 30; a step of forming the p-type AlGaN electron blocking layer 60 on the light emitting layer 40 (see step B); a step of forming the p-type contact layer 70 on the p-type AlGaN electron blocking layer 60 (see step C); and a step of forming the p-side reflection electrode 80 on the p-type contact layer 70 (see step D). Here, in an embodiment of this manufacturing method, the center emission wavelength of light emission from the light emitting layer 40 is 250 nm or greater and 330 nm or smaller, the Al composition ratio of the p-type AlGaN electron blocking layer 60 is 0.40 or greater and 0.80 or smaller, and the film thickness of the p-type contact layer 70 is 10 nm or greater and 50 nm or smaller. Further, the p-type contact layer 70 forms a p-type AlGaN contact layer 71 having a composition ratio of 0.03 or greater and 0.25 or smaller.

Figure 3:
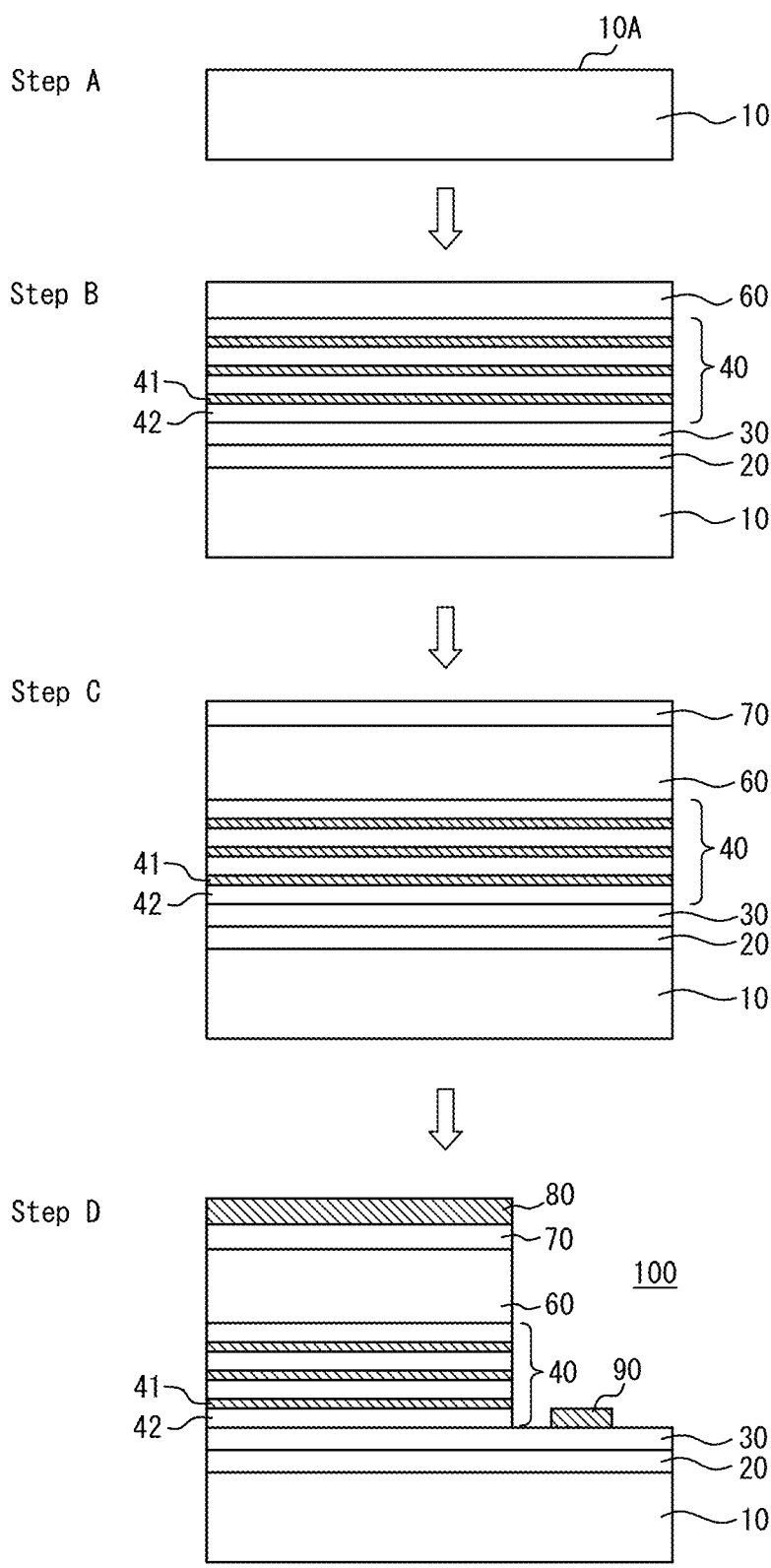
FIG. 3 is a schematic cross-sectional view illustrating an embodiment of a method of manufacturing a group III nitride semiconductor light emitting element according to this disclosure.
Figure 4A:
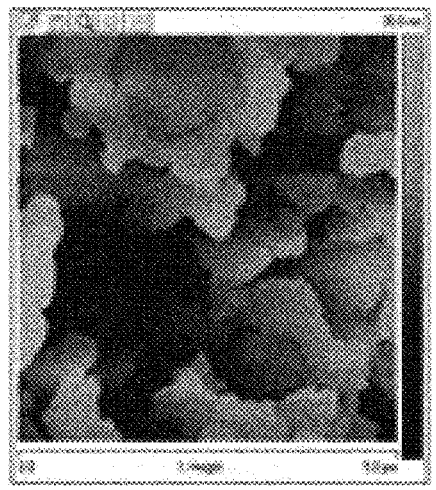
FIG. 4A is an AFM image of a p-type contact layer surface of Example 1.
Figure 4B:
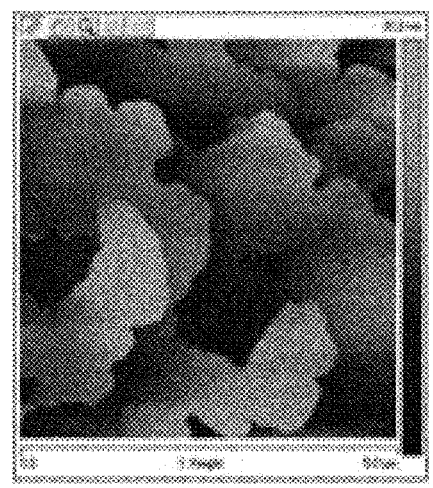
FIG. 4B is an AFM image of a p-type contact layer surface of Example 2.
Figure 4C:
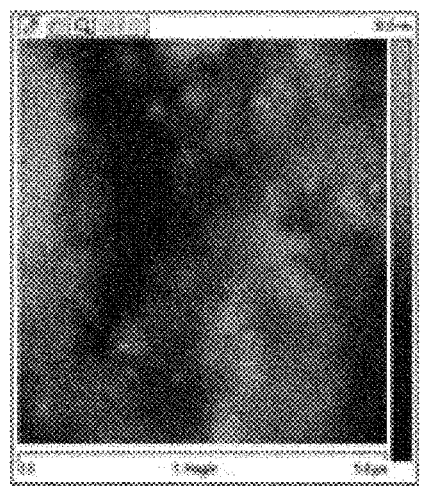
FIG. 4C is an AFM image of a p-type contact layer surface of Example 3.
Figure 4D:
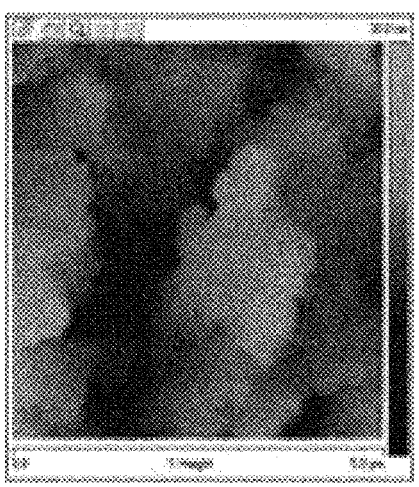
FIG. 4D is an AFM image of a p-type contact layer surface of Comparative Example 1.

Referring to FIG. 3 illustrating a flowchart according to a preferred embodiment of this embodiment, a specific mode and details of each step will be described in order. Explanations that are common to each configuration of the group III nitride semiconductor light emitting element 100 will be omitted.

First, as illustrated in steps A and B in FIG. 3, the n-type semiconductor layer 30, the light emitting layer 40, and the p-type AlGaN electron blocking layer 60 are formed, in this order, on the substrate 10. In each step, each layer may be formed by any of well-known epitaxial growth techniques, such as metal organic chemical vapor deposition (MOCVD), molecular beam epitaxy (MBE), and sputtering.

Typical conditions according to the Al composition ratio and the film thickness of each layer may be used as the growth temperature, the growth pressure, and the growth time for epitaxial growth of each of the n-type semiconductor layer 30, the light emitting layer 40, and the p-type AlGaN electron blocking layer 60. As a carrier gas for the epitaxial growth, hydrogen or nitrogen gas, or a mixture thereof may be supplied into a chamber. Further, examples of the source gases for the growth of each layer include TMA (trimethylaluminum) and TMG (trimethylgallium) as source gases of group III elements, and $NH_3$ gas as a group V element gas. A typically used conditions may also be used for the mole ratio of the group V elements to the group III elements (hereinafter referred to as the "V/III ratio"), which is calculated based on the flow rates of the growth gases, such as the group V element gas (e.g., $NH_3$ gas) and the group III element gas (e.g., TMA gas). Further, bis-cyclopentadienyl magnesium ($CP_2Mg$) gas and the like as the Mg source as a p-type dopant, and monosilane ($SiH_4$) gas as a Si source or zinc chloride ($ZnCl_2$) gas as a Zn source as a p-type dopant may be suitably selected as dopant source gases, and may be supplied into the chamber at certain flow rates, for example.

Next, in the p-type contact layer formation step illustrated in step C in FIG. 3, the p-type AlGaN contact layer 71 is formed on the p-type AlGaN electron blocking layer 60. The film thickness range of the p-type contact layer 70, the condition of the Al composition ratio of the p-type AlGaN contact layer 71 and formation of the p-type GaN contact layer 72 (not illustrated in FIG. 3, see FIG. 2) have been described above. Further, the p-type contact layer 70 may also be formed by epitaxial growth using MOCVD or the like, as with the p-type AlGaN electron blocking layer 60, or the like. Further, although the growth condition is not limited in particular, the growth speed in the thickness direction preferably satisfies 0.03 to 0.50 µm/h, more preferably satisfies 0.03 to 0.19 µm/h, and most preferably satisfies 0.10 to 0.15 µm/h, by adjusting the gas flow rate, the V/III ratio and the growth temperature. Note that it is preferable that $H_2$ is used as carrier gas.

Note that, in order to obtain high Mg concentration of the p-type contact layer 70, the Mg/group III element gas ratio may be adjusted as appropriate.

Figure 2:
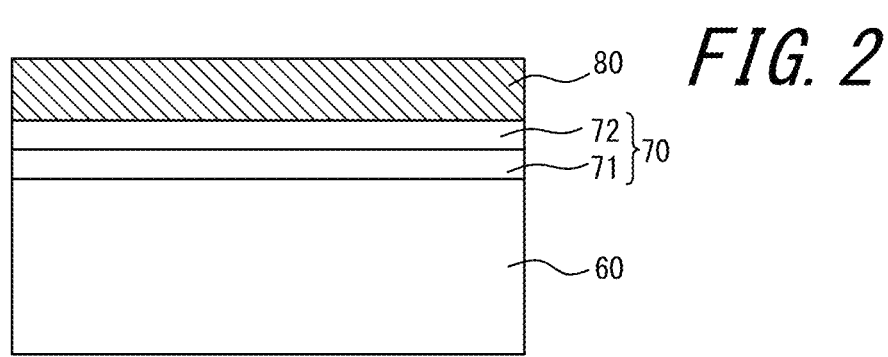
FIG. 2 is an enlarged schematic cross-sectional view illustrating an embodiment of a p-type contact layer of a group III nitride semiconductor light emitting element according to this disclosure.

Further, as illustrated in step D in FIG. 2, some portions of the light emitting layer 40, the p-type AlGaN electron blocking layer 60 and the p-type contact layer 70 may be removed by etching to form the n-side electrode 90 on the exposed n-type semiconductor layer 30. Note that the p-side reflection electrode 80 and the n-side electrode 90 may be formed by sputtering, vacuum evaporation, or the like. Further, it is preferable that the buffer layer 20 is formed on the surface 10A of the substrate 10.

EXAMPLES

This disclosure will be described in more detail below using Examples. However, this disclosure is not limited to the following Examples.

Example 1: Wavelength 280 nm

A sapphire substrate (diameter: 2 inches, film thickness: 430 µm, plane orientation: (0001), off-angle in the m-axis direction: 0.5 degrees) was provided. Subsequently, an AlN layer having a center film thickness of 0.60 μm (average film thickness: 0.61 μm) was grown on the sapphire substrate by MOCVD to prepare an AlN template substrate. In this process, the growth temperature of the AlN layer was 1300° C., the growth pressure inside the chamber was 10 Torr, and the growth gas flow rates of ammonia gas and TMA gas were set such that the V/III ratio was 163. The flow rates of the group V element gas ($NH_3$) and the group III element gas (TMA) are 200 sccm and 53 sccm, respectively. Upon measuring film thicknesses of the AlN layer, the film thicknesses of total 25 points distributed across the wafer at regular intervals, including the center of the wafer plane, were measured with an interference film thickness measurement system (NANOSPEC M6100A manufactured by Nanometrics Incorporated).

Next, the above-described AlN template substrate was loaded into a heat treatment furnace. The furnace was purged with nitrogen gas to create a nitrogen gas atmosphere in the furnace after the pressure was reduced to 10 Pa, then the temperature inside the furnace was raised, thus performing heat treatment onto the AlN template substrate. The heating temperature was 1650° C. and heating time was 4 hours.

Subsequently, an undoped AlGaN layer having a film thickness of 200 nm and composition-graded in the crystal growth direction of Al composition ratio from 0.85 to 0.65 was formed by MOCVD. Next, an n-type layer made of $Al_{0.65}Ga_{0.35}N$ doped with Si and having a film thickness of 2 μm was formed, as an n-type semiconductor layer. The Si concentration of the n-type layer determined by a SIMS analysis was $1.0\times10^{19}$ atoms/cm³.

Subsequently, on the n-type layer, an n-type guide layer made of $Al_{0.65}Ga_{0.35}N$, doped with Si, and having a film thickness of 20 nm was formed. Further, $Al_{0.65}Ga_{0.35}N$ having a film thickness of 4 nm was formed as a barrier layer. Subsequently, two well layers made of $Al_{0.45}Ga_{0.55}N$ and having a film thickness of 3 nm and two barrier layers made of $Al_{0.65}Ga_{0.35}N$ and having a film thickness of 4 nm were alternately formed, then a well layer made of $Al_{0.45}Ga_{0.55}N$ and having a film thickness of 3 nm was formed. That is, the number N of well layers and barrier layers is three each. The Al composition ratio b of the barrier layer is 0.65 and the Al composition ratio w of the well layer is 0.45. Note that Si was doped for forming barrier layers.

Thereafter, an undoped AlN guide layer was formed on the third well layer using nitrogen gas as carrier gas. The film thickness of the AlN guide layer was 1 nm. Next, nitrogen of the carrier gas was stopped and hydrogen was supplied while the TMA gas supply was stopped and the ammonia gas supply was continued to change the carrier gas to hydrogen. Thereafter TMA gas and TMG gas, which are source gases of the group III element, were supplied again to form an electron blocking layer made of $Al_{0.68}Ga_{0.32}N$, doped with Mg and having a film thickness of 40 nm.

Subsequently, after stopping the growth of the electron blocking layer, switching the carrier gas to the nitrogen gas, and changing the gas flow rate to the setting conditions of the p-type $Al_{0.08}Ga_{0.92}N$ contact layer, the carrier gas was switched to hydrogen to form a p-type $Al_{0.08}Ga_{0.92}N$ contact layer (hereinafter abbreviated as the "p-type contact layer") doped with Mg and having a film thickness of 20 nm. As a result of SIMS analysis, the Mg concentration of the p-type contact layer was $1.2\times10^{20}$ atom/cm³ on average. Note that the growth speed in the thickness direction when forming the p-type contact layer was set to 0.12 μm/h.

Thereafter, a mask was formed on the p-type contact layer, followed by mesa etching by dry etching to expose a part of the n-type semiconductor layer. Subsequently, a p-side electrode made of Ni/Au was formed on the p-type contact layer, and an n-side electrode made of Ti/Al was formed on the exposed n-type layer. Note that, in the p-side electrode, the film thickness of Ni is 50 Å, and the film thickness of Au is 1500 Å. Further, in the n-side electrode, the film thickness of Ti is 200 Å, and the film thickness of Al is 1500 Å. Finally, a contact anneal (RTA) was carried out at 550° C. to form each electrode.

Table 1 lists each layer structure of the group III nitride semiconductor light emitting element according to Example 1 produced as described above.

TABLE 1

| | Al composition ratio | Dopant | Film thickness |
|---|---|---|---|
| p-type contact layer | 0.08 | Mg | 20 nm |
| p-type electron blocking layer | 0.68 | Mg | 40 nm |
| AlN guide layer | 1 | — | 1 nm |
| Light emitting layer | 0.45 | — | 3 nm |
| | 0.65 | Si | 4 nm |
| | 0.45 | — | 3 nm |
| | 0.65 | Si | 4 nm |
| | 0.45 | — | 3 nm |
| | 0.65 | Si | 4 nm |
| n-type guide layer | 0.65 | Si | 20 nm |
| n-type semiconductor layer | 0.65 | Si | 2 μm |
| Undoped layer (composition graded layer) | 0.65 ⏐ 0.85 | | 200 nm |
| AlN layer | 1 | — | 0.6 μm |
| Sapphire substrate | — | — | 430 μm |

Examples 2-5, Examples 8-11, Comparative Example 1, Conventional Example 1, Comparative Examples 4 to 7: Wavelength 280 nm The group III nitride semiconductor light emitting elements according to Examples 2-5, Comparative Example 1 and Conventional Example 1 were produced in the same manner as Example 1 except that the film thickness and the Al composition ratio of the p-type contact layer in Example 1 were changed to those listed in Table 2. Note that, in Example 3, on the p-type $Al_{0.68}Ga_{0.32}N$ electron blocking layer, a p-type $Al_{0.08}Ga_{0.92}N$ contact layer having a film thickness of 20 nm was formed, and then a p-type GaN contact layer having a film thickness of 20 nm was formed. Further, the group III nitride semiconductor light emitting elements according to Examples 8 to 11 and Comparative Examples 4-7 were produced in the same manner as Example 1 except that the film thickness and the Al composition ratio of the p-type contact layer in Example 1 were changed to those listed in Table 2.

Example 6, Examples 12 to 13, Comparative Example 2, Conventional Example 2: Wavelength 310 nm The group III nitride semiconductor light emitting elements according to Example 6, Comparative Example 2 and Conventional Example 2 were produced in the same manner as Example 1 except that the film thickness and the Al composition ratio x of the p-type contact layer were changed to those listed in Table 2, while changing, in Example 1, the Al composition ratio w: 0.45 of the well layer to 0.30, the Al composition ratio of the undoped layer to 0.55, the Al composition ratio of the n-type semiconductor layer to 0.45, the Al composition ratio of the n guide layer and barrier layer to 0.55, and the Al composition ratio of the p-type electron blocking layer to 0.58. Further, the group III nitride semiconductor light emitting elements according to Examples 12 and 13 were produced in the same manner as Example 6 except that the film thickness and the Al composition ratio of the p-type contact layer in Example 6 were changed to those listed in Table 2.

Example 7, Example 14, Comparative Example 3, Conventional Example 3: Wavelength 265 nm The group III nitride semiconductor light emitting elements according to Example 7, Comparative Example 3 and Conventional Example 3 were produced in the same manner as Example 1 except that, in Example 1, the Al composition ratio w: 0.45 of the well layer was changed to 0.58, the Al composition ratio of the barrier layer was changed to 0.76, and the film thickness and the Al composition ratio x of the p-type contact layer were changed to those listed in Table 2.

Further, the group III nitride semiconductor light emitting element according to Example 14 was produced in the same manner as Example 7 except that the film thickness and the Al composition ratio of the p-type contact layer in Example 7 were changed to those listed in Table 2.

TABLE 2

| | Producing conditions | | | | Evaluation | | | |
|---|---|---|---|---|---|---|---|---|
| | | Al composition | p-type contact layer | | | | | |
| | Center emission wavelength [nm] | ratio of p-type electron blocking layer | Al compositon ratio of p-type contact layer | Film thickness [nm] | Light output power Po [mW] | Incidence of sudden death [%] | AFM Ra [nm] | Remarks |
| Example 1 | 280 | 0.68 | 0.08 | 20 | 68 | 0 | 4.42 | pit |
| Example 2 | | 0.68 | 0.08 | 40 | 58 | 0 | 3.32 | pit |
| Example 3 | | 0.68 | 0.08/0 | 20/20 | 67 | 0 | 2.52 | no pit |
| Example 4 | | 0.68 | 0.14 | 40 | 55 | 0 | 2.80 | pit |
| Example 5 | | 0.68 | 0.21 | 40 | 58 | 0 | 3.90 | no pit |
| Example 8 | | 0.68 | 0.25 | 40 | 64 | 0 | — | |
| Example 9 | | 0.68 | 0.25 | 50 | 56 | 0 | — | |
| Example 10 | | 0.68 | 0.08 | 50 | 54 | 0 | — | |
| Example 11 | | 0.68 | 0.03 | 50 | 55 | 0 | — | |
| Comparative Example 1 | | 0.68 | 0 | 20 | 60 | 17% | 2.55 | no pit |
| Conventional Example 1 | | 0.68 | 0 | 150 | 50 | 0 | — | |
| Comparative Example 4 | | 0.68 | 0 | 40 | 50 | 0 | — | |
| Comparative Example 5 | | 0.68 | 0.08 | 5 | X (Note 1) | 50% | — | |
| Comparative Example 6 | | 0.68 | 0.08 | 60 | 46 | 0 | — | |
| Comparative Example 7 | | 0.68 | 0.30 | 20 | 65 | 33% | — | |
| Example 6 | 310 | 0.54 | 0.08 | 20 | 67 | 0 | — | |
| Example 12 | | 0.54 | 0.08 | 40 | 68 | 0 | — | |
| Example 13 | | 0.54 | 0.21 | 40 | 82 | 0 | — | |
| Comparative Example 2 | | 0.54 | 0 | 20 | 67 | 17% | — | |
| Conventional Example 2 | | 0.54 | 0 | 150 | 55 | 0 | — | |
| Example 7 | 265 | 0.68 | 0.08 | 20 | 76 | 0 | — | |
| Example 14 | | 0.68 | 0.08 | 40 | 41 | 0 | — | |
| Comparative Example 3 | | 0.68 | 0 | 20 | X (Note 1) | 50% | — | |
| Conventional Example 3 | | 0.68 | 0 | 150 | 34 | 0 | — | |

Note 1: unmeasurable

Evaluation 1: Measurement of Film Thickness and Al Composition of Each Layer

With respect to Examples 1-7 and 8-14, Comparative Examples 1-3 and 4-7 and Conventional Example 1-3, the film thickness of each layer formed by epitaxial growth was measured using an interference thickness measurement system. Further, with respect to thin layers including barrier layer and electron blocking layer that have a film thickness of several nm to several tens of nm, the film thickness and Al composition ratio of each layer were measured using TEM-EDS in cross-sectional observation of each layer with a transmission electron microscope. Note that the measurement position of the film thickness of each layer is the central portion of the wafer.

Evaluation 2: Reliability Evaluation

Current of 20 mA was applied using a constant current voltage power supply to each light emitting element (number of measurements: 24) obtained from Examples 1-7 and 8-14, Comparative Examples 1-3 and 4-7 and Conventional Examples 1-3 to measure the light output power, then again 20 mA was applied thereto after 100 mA was applied to measure the light output power, thus the change in the light output power from the initial light output power was measured. In this process, the area that emits light when current was applied was 0.057 mm$^2$. The number of light emitting element whose light output power was dropped to less than half the initial light output power after application of 100 mA for three seconds, that is, the number of light emitting elements in which sudden death occurred was confirmed. Although significant changes were not observed with Examples 1-7 and Conventional Examples 1-3 after application of 100 mA, for Comparative Examples 1-3, light emitting elements that have no light emission in wafers or that have light output power dropped to less than half the initial light output power, after application of 100 mA, were confirmed (i.e., occurrence of sudden death was confirmed). Ratio of the light emitting elements that had no light emission described above or had no drastic decrease in the light output power to half the initial light output power are listed, as an incidence of sudden death, in Table 2. Note that an integrating sphere was used for measuring the light output power Po. The results of the average value of the initial light output power and the incidence of sudden death are shown in Table 2. The center emission wavelengths of each sample were measured using an optical fiber spectrometer. Table 2 also shows the center emission wavelength.

Evaluation 3: Measurement of Surface Roughness Ra

As a typical example, with respect to the outermost surface of each p-type contact layer of Examples 1-5 and Comparative Example 1, Ra (average roughness; in accordance with JIS B 0601: 2001) was measured as an index of surface roughness while acquiring an AFM image with an atomic force microscope (AFM). Note that the measurement point is the central part of the wafer. The measured values of Ra are shown in Table 2. Note that, with respect to Examples 1-5 and Comparative Example 1, the presence or absence of pits by substrate observation is also shown. Further, AFM images according to Examples 1-3 and Comparative Example 1 are shown in FIGS. 4A-4D, respectively.

Examination of Evaluation Results

In Examples 1-7 according to the conditions of the present disclosure, when compared at the same wavelength, the light output power could be increased as compared with each of Conventional Examples 1-3 while maintaining reliability. In Comparative Examples 1 and 2, the thickness of the p-type contact layer was reduced, and as a result light absorption from the light emitting layer could be suppressed, and light output power could be increased, but occurrence of sudden death was observed. In Comparative Example 3, the light output power could not even be measured because of the frequent sudden deaths from the initial application of current.

From the AFM images shown in FIGS. 4A-4D and the surface roughness Ra values of Examples 1-5 and Comparative Example 1, it is confirmed that, even if the surface roughness is sufficiently small, sudden death occurs. Considering the fact that pits were observed in Examples 1, 2, 4 and Comparative Example 1, it can be thought that it is important to embed irregularities or dislocations of the electron blocking layer and suppress an increase in crystal defects due to reduction in the compression strain as well to prevent sudden death.

Further, comparing Examples 1-5 and 8-11 with Comparative Examples 1, 4-7, and Conventional Example 1 at a wavelength of 280 nm, the Examples 1-5 and 8-11 have the Al composition ratio of the p-type contact layer in the range of 0.03-0.25 and the film thickness in the range of 10-50 nm, and thus it can be seen that a light emitting element having a light output power larger than before can be obtained without causing sudden death. The same results can be seen with Examples 6, 12 and 13 at the wavelength of 310 nm and Examples 7 and 14 at the wavelength of 265 nm.

Hence, it was concluded that, on the basis of the above-described results, both high light output power and reliability can be obtained by forming a p-type contact layer that satisfies the conditions of this disclosure.

INDUSTRIAL APPLICABILITY

According to this disclosure, a group III nitride semiconductor light emitting element that has both a high light output power and an excellent reliability and a method of manufacturing the same can be provided.

REFERENCE SIGNS LIST

10 Substrate
20 Buffer layer
30 n-type semiconductor layer
40 Light emitting layer
41 Well layer
42 Barrier layer
60 p-type AlGaN electron blocking layer
70 p-type contact layer
71 p-type AlGaN contact layer
72 p-type GaN layer
80 p-side reflection electrode
90 n-side electrode
100 Group III nitride semiconductor light emitting element

The invention claimed is:
1. A group III nitride semiconductor light emitting element, comprising:
a substrate;
an n-type semiconductor layer on the substrate;
a light emitting layer on the n-type semiconductor layer;
a p-type AlGaN electron blocking layer on the light emitting layer;
a p-type contact layer directly on the p-type AlGaN electron blocking layer; and
a p-side reflection electrode on the p-type contact layer, wherein:
a center emission wavelength of light emitted from the light emitting layer is 250 nm or greater and 280 nm or smaller;
an Al composition ratio of the p-type AlGaN electron blocking layer is 0.40 or greater and 0.80 or smaller;
a film thickness of the p-type contact layer is 10 nm or greater and 25 nm or smaller; and
the p-type contact layer has a p-type AlGaN contact layer having an Al composition ratio of 0.03 or greater and 0.25 or smaller.
2. The group III nitride semiconductor light emitting element according to claim 1, wherein the p-type contact layer is made only of the p-type AlGaN contact layer.

3. The group III nitride semiconductor light emitting element according to claim 1, wherein the p-type contact layer has a p-type GaN contact layer between the p-type AlGaN contact layer and the p-side reflection electrode.

4. The group III nitride semiconductor light emitting element according to claim 1, wherein the light emitting layer has a multiple quantum well structure in which a well layer has an Al composition ratio of 0.45 or more.

5. The group III nitride semiconductor light emitting element according to claim 1, wherein the p-type contact layer has a concentration region having a Mg concentration of $3\times10^{20}$ atoms/cm$^3$ or greater and $1\times10^{21}$ atoms/cm$^3$ or less on a side in contact with the p-side reflection electrode.

6. The group III nitride semiconductor light emitting element according to claim 1, wherein the p-type contact layer has a concentration region having a Mg concentration of $5\times10^{19}$ atoms/cm$^3$ or greater and $2\times10^{20}$ atoms/cm$^3$ or less on a side in contact with the p-type AlGaN electron blocking layer.

7. A method of manufacturing a group III nitride semiconductor light emitting element, comprising:
   a step of forming an n-type semiconductor layer on a substrate;
   a step of forming a light emitting layer on the n-type semiconductor layer;
   a step of forming a p-type AlGaN electron blocking layer on the light emitting layer;
   a step of forming a p-type contact layer directly on the p-type AlGaN electron blocking layer; and
   a step of forming a p-side reflection electrode on the p-type contact layer, wherein:
   a center emission wavelength from the light emitting layer is 250 nm or greater and 280 nm or smaller;
   an Al composition ratio of the p-type AlGaN electron blocking layer is 0.40 or greater and 0.80 or smaller;
   a film thickness of the p-type contact layer is 10 nm or greater and 25 nm or smaller; and
   the p-type contact layer has a p-type AlGaN contact layer having an Al composition ratio of 0.03 or greater and 0.25 or smaller.

8. The method of manufacturing a group III nitride semiconductor light emitting element according to claim 7, wherein the light emitting layer has a multiple quantum well structure in which a well layer has an Al composition ratio of 0.45 or more.

* * * * *